(12) United States Patent
Petrick et al.

(10) Patent No.: US 6,426,672 B1
(45) Date of Patent: Jul. 30, 2002

(54) MEANS OF SELECTING LOW NOISE PERFORMANCE OR LOW POWER DISSIPATION IN THE ANALOG FRONT END OF A CUSTOM INTEGRATED CIRCUIT

(75) Inventors: Scott W. Petrick, Sussex; Lawrence R. Skrenes, Hartland; Douglas E. Sease, Waukesha, all of WI (US); Richard D. Baertsch, Scotia, NY (US)

(73) Assignee: General Electric Company, Milwaukee, WI (US)

( * ) Notice: Subject to any disclaimer, the term of this patent is extended or adjusted under 35 U.S.C. 154(b) by 533 days.

(21) Appl. No.: 08/919,936

(22) Filed: Aug. 28, 1997

(51) Int. Cl.[7] ........................................... H03K 19/0948
(52) U.S. Cl. ........................................ 327/544; 327/530
(58) Field of Search ................................. 327/530, 538, 327/540, 541, 544; 330/296

(56) References Cited

U.S. PATENT DOCUMENTS 4,516,082 A  *  5/1985  Smith et al. ................. 330/296
5,583,457 A  * 12/1996  Horiguchi et al. ........... 327/544

* cited by examiner

*Primary Examiner*—Dinh T. Le
(74) *Attorney, Agent, or Firm*—Barbara Joan Haushalter; Peter Vogel

(57) ABSTRACT

A signal processing circuit can be used to select between a high bias current and good noise performance or a low bias current and poorer noise performance. The circuit comprises an input device having high impedance and low noise characteristics. A first current source provides a minimal current level through the input device. Additional current sources provide additional current through the input device to improve noise performance of the circuit. The additional current sources can be switched into the circuit when improved noise performance is required, and switched out of the circuit to conserve power when improved noise performance is not required.

5 Claims, 1 Drawing Sheet

MEANS OF SELECTING LOW NOISE PERFORMANCE OR LOW POWER DISSIPATION IN THE ANALOG FRONT END OF A CUSTOM INTEGRATED CIRCUIT

TECHNICAL FIELD

The present invention relates to integrated circuits and more particularly, to improving the compromise between noise performance and power consumption of a custom integrated circuit.

BACKGROUND ART

In applications, such as some X-ray imaging applications, that require low level, low noise analog signal processing, often a field effect transistor (FET), or a device with a FET, is chosen as the input device. FET devices have desirable high impedance, low noise characteristics. It is known that the noise of an FET device, when properly biased will be inversely proportional to the 4th root of the magnitude of the channel (source to drain) bias current. One means of improving the noise performance of the circuit then, is to increase the bias current through the input FET.

Increasing the bias current increases power dissipation, in direct proportion to the bias current, which is an undesirable side effect. This is further compounded when a large number of independent channels are required at the system level, as the power dissipation for the system now increases proportionally by the number of channels required. Yet this increased power dissipation is wasted when the circuit is used in conjunction with higher noise input signals.

It would be desirable, then, to have a means for selecting low noise performance or low power dissipation in the analog front end of a custom integrated circuit. For economic reasons, it is desirable to apply the custom integrated circuit which implements the analog signal processing to as many applications as possible, whereby one design solves multiple problems, rather than requiring a unique solution for each problem.

SUMMARY OF THE INVENTION

X-ray applications may be diagnostic, requiring high input signal levels and, therefore, requiring less circuit noise control; or fluoroscopic, having low input signal noise and, therefore, requiring improved circuit noise control. When the signal level can be determined prior to analog processing, the present invention provides for a means to select between low power or low noise for the circuit.

In accordance with one aspect of the present invention, additional current sources which improve the noise performance of the circuit are switched into the circuit when better noise performance is required and switched out of the circuit in order to conserve power when poorer noise performance can be tolerated.

Accordingly, it is an object of the present invention to provide a means to select between low noise performance or low power dissipation for a custom integrated circuit. This has the advantage of conserving power and reducing heat for the circuit, according to actual user requirements.

Other objects and advantages of the invention will be apparent from the following description, the accompanying drawings and the appended claims.

DETAILED DESCRIPTION OF THE PREFERRED EMBODIMENTS

In diagnostic type X-ray applications using only higher levels of radiation, such as mammography, radiography and dental applications, it would be desirable to configure the circuit for low power dissipation. In such applications, since the high signal resulting from high X-ray dose makes electronic noise less of a concern, noise performance of the circuit does not need to be improved and, therefore, bias current does not need to be increased. Conversely, in fluoroscopic type X-ray applications, it is desirable to keep the electronic noise level below the low X-ray noise. Hence, it is necessary in these applications to configure the circuit for much lower noise and tolerate an increase in power dissipation. Improving the noise performance can be accomplished by increasing the bias current and, thereby, the power dissipation.

The above is also true for any application involving low level input signals, and it will be obvious to those skilled in the art that the concept of the present invention is not solely limited to the detection of X-rays. Detection of low levels of light, sound, other forms of electromagnetic energy and any low level signals could benefit by implementation of the present invention.

Figure 1:
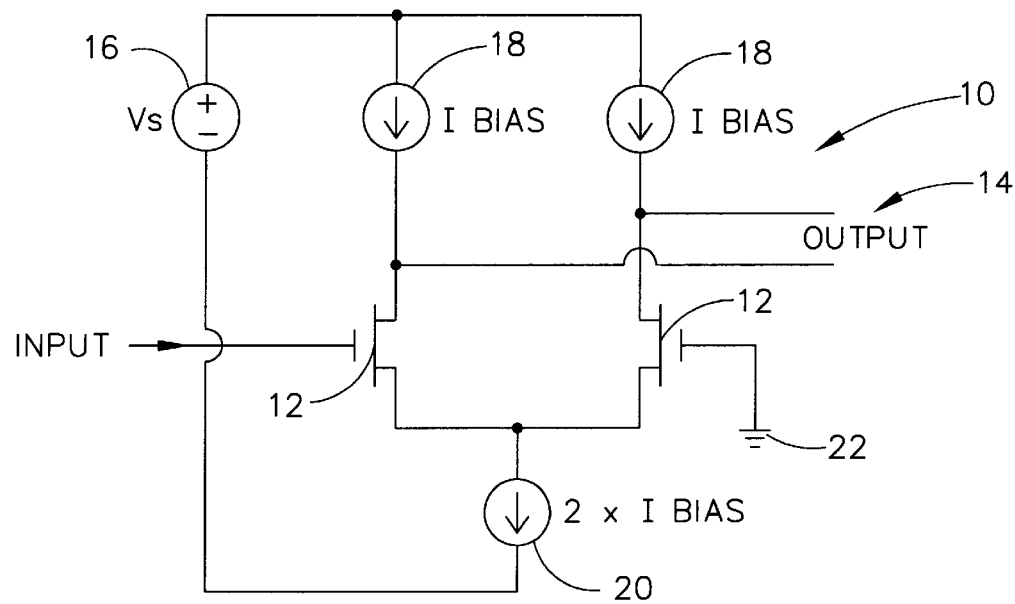
FIG. 1 is a prior art schematic block diagram of the differential input stage of a typical analog signal processing circuit and FIG. 2 is a schematic block diagram of the differential input stage of an analog signal processing circuit incorporating the low noise or low power selection option in accordance with the present invention.

Referring now to FIG. 1, there is illustrated a prior art schematic block diagram of the differential input stage of a typical analog signal processing circuit 10. As is typical for applications requiring low level, low noise analog signal processing, the circuit comprises two input devices, or FETs, 12, having high impedance and low noise characteristics. The circuit further comprises a differential output 14, a voltage source 16, bias current sources 18, a differential current source 20, and ground 22.

As bias current through the FET's 12 is increased, the noise level decreases. Therefore, when it is desired to improve the noise performance of the circuit, the bias current 18 through the FETs 12 can be increased. Unfortunately, this, in turn, increases the power dissipation, in direct proportion to the bias current. When the input signal noise level can be determined prior to analog processing, either by detection or prior knowledge of the particular application, the present invention provides for a means to select between a high bias current/low noise (low noise input signal) operating point and a low power/higher noise (higher noise input signal) operating point.

Figure 2:
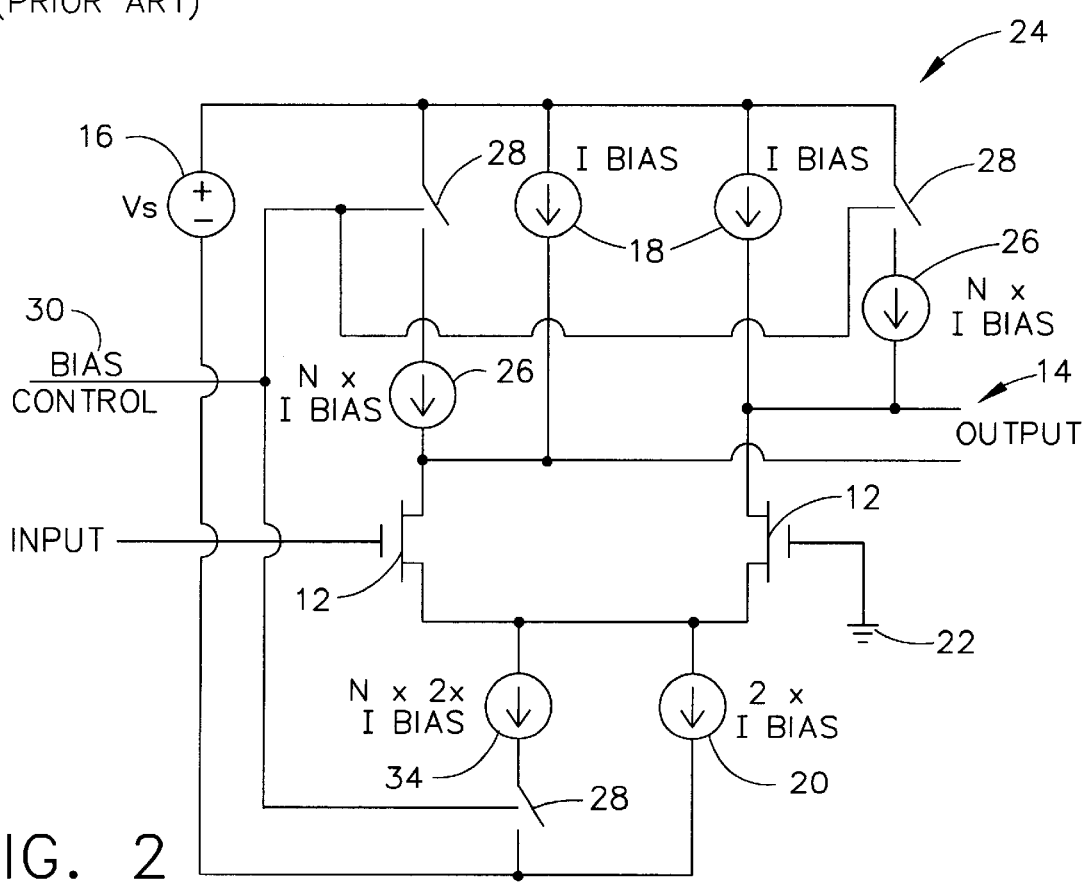

Referring now to FIG. 2, there is illustrated a schematic block diagram of the differential input stage of an analog signal processing circuit 24, incorporating the low noise or low power selection option in accordance with the present invention. The means for selecting between low noise or low power comprises three additional current sources, two of which are identical, N×Ibias, 26, and a third, N×2×Ibias, 34, which is different, each in series with a switch 28. The switch 28 may be controlled by a logic input, bias control input 30, to the circuit 24. Control is administered such that all the switches 28 will be on or off simultaneously. It should be noted that the switching can be implemented in various ways, including, but not limited to solid state devices, metal mask or laser trim during the integrated circuit manufacturing process, or even a wire or metal interconnecting line which is broken or left intact.

In low input signal level situations, such as for fluoroscopic X-ray applications, all switches 28 would be closed and the bias current of the FETs 12 would be higher, along with the power dissipation, while the circuit noise would be lower. This allows the operator to maintain the electronic noise level below the input signal noise level.

In high input signal level situations, such as for radiographic X-ray applications, all switches 28 would be open, resulting in lower bias current, lower power dissipation, but with higher noise. However, the noise level of the circuit is less relevant in such situations, since the high input signal noise level will be greater than the circuit noise.

The two input FETs 12 of FIG. 1 can be described as variable impedance devices whose impedance is controlled by the voltage between the gate (the input and ground terminal for the left and right FETs, respectively) and the common source terminals of both FETs. The source of each of these two devices is tied to the same node, that of the positive end of the differential current source 20. Both of these devices therefore have identical voltage references. Furthermore, the sum of the currents allowed through the two input FETs 12 can only be 2×Ibias. The output is formed as the difference in voltage between the drain of each of the FETs 12. The voltage at either drain is the product of the impedance of that FET, as determined by the gate voltage, and the source drain current (Ibias), plus the source voltage. Looking at the output in differential fashion, the source voltage subtracts out (is common mode). Since the FETs 12 are identical by design and both have the same source drain current (Ibias), the differential output voltage is proportional to the difference in voltage between the gates of the two FETs 12, or in the case of FIG. 1, the difference in voltage between the input and ground. In general, the bias and differential currents are chosen to be consistent with the expected load impedance as well as other desired circuit performance characteristics, such as noise, bandwidth, gain, and power dissipation.

The circuit of FIG. 2 differs in that the bias and differential currents are selectable between Ibias and (N+1)×Ibias; and 2×Ibias and (N+1)×2×Ibias, respectively. Because the present invention has been described pertaining to the input stage of a differential analog signal processing circuit, all of the current sources are increased, or decreased, by a proportional amount when switching between the low noise and low power operating modes. Thus, there will be an additional current source along with a controlling switch in FIG. 2 for each of the current sources depicted in FIG. 1.

The signal processing circuit of the present invention, when fabricated as part of a custom integrated circuit, allows the circuit to be applied to either low noise or low power applications. This results in more cost effective solutions due to economies of scale. Furthermore, the signal processing circuit of the present invention, as applied to applications requiring both low power and low noise, results in a solution which consumes less power, except when higher performance is required.

Although the invention has been described relative to X-ray applications, it will be obvious to those skilled in the art that the concept of providing a means for selecting between low power dissipation and low noise is applicable to a variety of other applications. Furthermore, the actual selection means can be varied or modified, without departing from the scope of the invention. For example, depending upon the analog signal processing desired, other implementations, including single ended circuits, and other circuits using other input devices such as BJTs and JFETs, may be possible.

The invention has been described in detail with particular reference to certain preferred embodiments thereof, but it will be understood that modifications and variations can be effected within the spirit and scope of the invention.

We claim:

1. A signal processing circuit comprising:

a first current source for providing a minimal current level through an input device;

an additional current source means for providing additional current through the input device to increase noise control of the circuit; and switching means for switching the additional current source means into the circuit when the increased noise control is required, and switching the additional current source means out of the circuit to conserve power when the increased noise control is not required.

2. The signal processing circuit as claimed in claim 1 wherein the input device comprises at least one field effect transistor.

3. The signal processing circuit as claimed in claim 1 wherein the additional current source means comprises multiple current sources.

4. The signal processing circuit as claimed in claim 3 wherein the multiple current sources are in series with the switching means.

5. The signal processing circuit as claimed in claim 3 wherein the multiple current sources comprise three current sources.

* * * * *